(12) United States Patent
Xu (10) Patent No.: US 9,507,378 B2
(45) Date of Patent: Nov. 29, 2016

(54) FLAT PANEL ELECTRONIC DEVICE, AUXILIARY HEAT-DISSIPATING MEANS THEREOF AND ASSEMBLY OF BOTH

(71) Applicant: NVIDIA Corporation, Santa Clara, CA (US)

(72) Inventor: Shuang Xu, Shenzhen (CN)

(73) Assignee: NVIDIA CORPORATION, Santa Clara, CA (US)

( * ) Notice: Subject to any disclaimer, the term of this patent is extended or adjusted under 35 U.S.C. 154(b) by 232 days.

(21) Appl. No.: 13/776,605

(22) Filed: Feb. 25, 2013

(65) Prior Publication Data

US 2014/0126148 A1  May 8, 2014

(30) Foreign Application Priority Data

Nov. 7, 2012  (CN) .......................... 2012 1 0441514

(51) Int. Cl.
| | |
|---|---|
| *H05K 7/20* | (2006.01) |
| *G06F 1/16* | (2006.01) |
| *G06F 1/20* | (2006.01) |
| *H01L 23/473* | (2006.01) |
| *H04M 1/04* | (2006.01) |

(52) U.S. Cl.
CPC ............. *G06F 1/1632* (2013.01); *G06F 1/203* (2013.01); *H05K 7/20963* (2013.01); *H04M 1/04* (2013.01)

(58) Field of Classification Search
CPC .............................. G06F 1/181–1/182; H05K 7/20218–7/20381; H05K 7/20409–7/20418; H05K 7/20009–7/202; H01L 23/473; H01L 23/367–23/3677; H01L 23/46–23/467
USPC ........................ 361/679.46–679.54, 688–723, 361/676–678, 807, 809, 810; 165/80.1–80.5, 104.33, 185; 174/15.1–15.3, 16.1–16.3, 547–548; 257/712–722, E23.088; 348/787, 789, 348/794; 349/58–60; 24/453, 458–459
See application file for complete search history.

(56) References Cited

U.S. PATENT DOCUMENTS

| | | | |
|---|---|---|---|
| 3,836,823 A * | 9/1974 | Shields .......................... | 361/689 |
| 4,872,090 A * | 10/1989 | Taylor et al. ................. | 361/818 |
| 5,115,388 A | 5/1992 | Shigekane | |
| 5,159,534 A * | 10/1992 | Hudson et al. ............... | 361/730 |
| 5,642,262 A | 6/1997 | Terrill et al. | |
| 5,710,733 A | 1/1998 | Chengson et al. | |
| 5,742,477 A | 4/1998 | Baba | |
| 5,742,577 A | 4/1998 | Horimai et al. | |
| 5,941,447 A | 8/1999 | Chu et al. | |
| 5,974,493 A | 10/1999 | Okumura et al. | |
| 5,974,556 A | 10/1999 | Jackson et al. | |

(Continued)

FOREIGN PATENT DOCUMENTS

| | | |
|---|---|---|
| CN | 1933711 | 3/2007 |
| CN | 200969073 Y | 10/2007 |

(Continued)

*Primary Examiner* — Anthony Haughton
*Assistant Examiner* — Razmeen Gafur (57) ABSTRACT

An apparatus for dissipating heat is presented. The apparatus comprises a base provided with a recess on a top thereof for containing a portion of a flat panel electronic device. It also comprises a base heat sink disposed in the base. Finally, it comprises a heat-conducting plug with a first end thereof thermally contacting with the base heat sink, and a second end thereof extending upward from a bottom of the recess for plugging into a heat-conducting socket of the flat panel electronic device when the flat panel electronic device is placed on the base.

21 Claims, 5 Drawing Sheets

(56) References Cited

U.S. PATENT DOCUMENTS

| | | | |
|---|---|---|---|
| 5,978,281 A | 11/1999 | Anand et al. | |
| 5,999,437 A | 12/1999 | Chengson et al. | |
| 6,008,538 A | 12/1999 | Akram et al. | |
| 6,084,769 A * | 7/2000 | Moore | G06F 1/1632 165/104.33 |
| 6,115,278 A | 9/2000 | Deneroff et al. | |
| 6,172,871 B1 | 1/2001 | Holung et al. | |
| 6,181,553 B1 | 1/2001 | Cipolla et al. | |
| 6,181,556 B1 * | 1/2001 | Allman | G06F 1/20 165/185 |
| 6,188,189 B1 | 2/2001 | Blake | |
| 6,208,509 B1 | 3/2001 | Cha | |
| 6,209,075 B1 | 3/2001 | Lau | |
| 6,229,701 B1 | 5/2001 | Kung et al. | |
| 6,243,272 B1 | 6/2001 | Zeng et al. | |
| 6,285,558 B1 | 9/2001 | Frantz et al. | |
| 6,301,121 B1 | 10/2001 | Lin | |
| 6,349,032 B1 * | 2/2002 | Chan | H01L 23/4093 257/718 |
| 6,408,935 B1 * | 6/2002 | DeHoff et al. | 165/80.3 |
| 6,415,612 B1 | 7/2002 | Pokharna et al. | |
| 6,424,034 B1 | 7/2002 | Ahn et al. | |
| 6,528,735 B1 | 3/2003 | Bhatia et al. | |
| 6,532,152 B1 * | 3/2003 | White et al. | 361/692 |
| 6,545,895 B1 | 4/2003 | Li et al. | |
| 6,665,195 B1 * | 12/2003 | Drabon | H02M 7/003 361/709 |
| 6,677,668 B1 | 1/2004 | Lin | |
| 6,822,856 B2 | 11/2004 | Fujiwara | |
| 6,831,838 B1 * | 12/2004 | Boyce | B23K 9/32 174/16.1 |
| 6,836,849 B2 | 12/2004 | Brock et al. | |
| 6,849,943 B2 * | 2/2005 | Thurk | H02M 1/44 257/675 |
| 6,891,729 B2 * | 5/2005 | Ko | G11C 5/04 174/250 |
| 7,149,907 B2 | 12/2006 | McAfee et al. | |
| 7,245,099 B2 | 7/2007 | Yamamoto et al. | |
| 7,353,859 B2 * | 4/2008 | Stevanovic | H01L 23/473 165/170 |
| 7,455,450 B2 | 11/2008 | Liu et al. | |
| 7,471,505 B2 | 12/2008 | Gull et al. | |
| 7,511,436 B2 | 3/2009 | Xu | |
| 7,665,207 B2 * | 2/2010 | Fraley | H01L 23/145 174/260 |
| 7,876,559 B2 * | 1/2011 | Shabbir | H05K 7/20727 165/104.33 |
| 8,040,710 B2 * | 10/2011 | Bacha | G06F 13/1684 365/63 |
| 8,064,197 B2 | 11/2011 | Mowry et al. | |
| 8,264,851 B2 * | 9/2012 | Jafari | G06F 1/183 361/704 |
| 8,264,856 B2 * | 9/2012 | Snider | H04B 1/082 358/511 |
| 8,310,855 B2 * | 11/2012 | Riho | G11C 5/02 257/686 |
| 8,583,174 B2 | 11/2013 | Wu et al. | |
| 2002/0066956 A1 | 6/2002 | Taguchi | |
| 2003/0216962 A1 | 11/2003 | Heller et al. | |
| 2004/0080909 A1 | 4/2004 | Kitahara | |
| 2005/0010827 A1 | 1/2005 | McAfee et al. | |
| 2005/0018386 A1 * | 1/2005 | Beihoff | B60L 11/12 361/676 |
| 2005/0032496 A1 | 2/2005 | Saeki | |
| 2005/0066672 A1 | 3/2005 | Yamamoto et al. | |
| 2005/0152101 A1 * | 7/2005 | Rodriguez | H05K 7/20272 361/605 |
| 2006/0061969 A1 * | 3/2006 | Nilson | H05K 1/0204 361/704 |
| 2006/0082975 A1 * | 4/2006 | Caines | H05K 5/061 361/719 |
| 2006/0236014 A1 | 10/2006 | Yin et al. | |
| 2006/0262500 A1 | 11/2006 | Huang et al. | |
| 2007/0097616 A1 * | 5/2007 | Su | G06F 1/187 361/679.31 |
| 2007/0119583 A1 * | 5/2007 | Foster | H01L 23/427 165/185 |
| 2007/0242426 A1 * | 10/2007 | Coster | G06F 1/181 361/679.48 |
| 2008/0062651 A1 * | 3/2008 | Reis et al. | 361/710 |
| 2008/0112132 A1 * | 5/2008 | Ehler | H05K 7/209 361/688 |
| 2008/0112139 A1 * | 5/2008 | Vinciarelli et al. | 361/709 |
| 2008/0136355 A1 | 6/2008 | Han et al. | |
| 2008/0188994 A1 | 8/2008 | Singh et al. | |
| 2008/0273297 A1 | 11/2008 | Kumar | |
| 2008/0288124 A1 | 11/2008 | Huang | |
| 2008/0294296 A1 | 11/2008 | Liu et al. | |
| 2009/0077296 A1 | 3/2009 | Mok et al. | |
| 2009/0122003 A1 | 5/2009 | Chen et al. | |
| 2009/0222147 A1 | 9/2009 | Nakashima et al. | |
| 2009/0259348 A1 | 10/2009 | Syu | |
| 2009/0312874 A1 | 12/2009 | Herman et al. | |
| 2010/0013849 A1 | 1/2010 | Yun et al. | |
| 2010/0296238 A1 | 11/2010 | Mowry et al. | |
| 2011/0002098 A1 | 1/2011 | Xu | |
| 2011/0007473 A1 * | 1/2011 | Franz | G06F 1/183 361/679.33 |
| 2011/0043995 A1 | 2/2011 | Chen et al. | |
| 2011/0279970 A1 * | 11/2011 | Guan | G06F 1/20 361/679.47 |
| 2012/0127665 A1 * | 5/2012 | Prete | G06F 1/20 361/704 |
| 2014/0092555 A1 | 4/2014 | Hua et al. | |
| 2014/0125251 A1 | 5/2014 | Hua et al. | |

FOREIGN PATENT DOCUMENTS

| | | |
|---|---|---|
| CN | 101334683 | 12/2008 |
| TW | 200522796 A | 7/2005 |
| TW | 347024 U | 12/2008 |
| TW | 201027319 A1 | 7/2010 |
| TW | 417594 U | 12/2011 |

* cited by examiner

FLAT PANEL ELECTRONIC DEVICE, AUXILIARY HEAT-DISSIPATING MEANS THEREOF AND ASSEMBLY OF BOTH

CROSS-REFERENCE TO RELATED APPLICATIONS

This application claims priority to Chinese Patent Application No. 201210441514.1, filed on Nov. 7, 2012, which is hereby incorporated by reference in its entirety.

FIELD OF INVENTION

The present invention relates generally to flat panel electronic devices and more particularly to heat dissipation technology for flat panel electronic devices.

BACKGROUND

Heat dissipation is one of the primary limiting factors that designers of flat panel electronic devices, for example, tablet PCs, a flat panel mobile phone, etc., need to contend with during the design and development of the flat panel electronic device. The housing for such flat panel electronic devices is usually designed to be sealed because there is a need for protecting the internal electronic components and preventing dust from entering. However, sealing the housing causes heat accumulation in the interior of the flat panel electronic device. In order to prevent rapid deterioration or even burning of the electronic components caused by significant heat accumulation in the flat panel electronic device, the processing speed of the prime heat-dissipating element, such as a processor, is usually reduced, thereby, unfortunately limiting the performance of the flat panel electronic device.

SUMMARY OF THE INVENTION

Accordingly, there is a need for providing a flat panel electronic device, an auxiliary heat-dissipating means within the flat panel electronic device, and an assembly of both to address the heat accumulation problem described above.

In one embodiment, an apparatus for dissipating heat is disclosed. The apparatus comprises a base provided with a recess on a top thereof for containing a portion of a flat panel electronic device. The apparatus also comprises a base heat sink disposed in the base. Finally, the apparatus comprises a heat-conducting plug with a first end thereof thermally contacting with the base heat sink, and a second end thereof extending upward from a bottom of the recess for plugging into a heat-conducting socket of the flat panel electronic device when the flat panel electronic device is placed on the base.

In another embodiment a flat panel electronic device is presented. The flat panel electronic device comprises a heat-conducting socket thereon such that a heat-conducting plug of an auxiliary heat-dissipating module is plugged into the heat-conducting socket when the flat panel electronic device is placed on a base of the auxiliary heat-dissipating module. It also comprises a heat-generating element, wherein the heat-conducting socket is disposed near the heat-generating element, and the heat-conducting socket exposes at least a portion of the heat-generating element.

Finally, in a different embodiment, an assembly of a flat panel electronic device and a heat-dissipating module is disclosed. The assembly comprises a flat panel electronic device provided with a heat-conducting socket thereon, wherein the heat-conducting socket is disposed near a heat-generating element of the flat panel electronic device, and the heat-conducting socket exposes at least a portion of the heat-generating element. The assembly also comprises a heat-dissipating module. The heat-dissipating module comprises a base provided with a recess on a top thereof for containing a portion of a flat panel electronic device. It also comprises a base heat sink disposed in the base. Finally, the heat dissipating module comprises a heat-conducting plug with a first end thereof thermally contacting with the base heat sink, and a second end thereof extending upward from a bottom of the recess for plugging into a heat-conducting socket of the flat panel electronic device when the flat panel electronic device is placed on the base.

Advantages and features of the present invention will be described in detail below in connection with the accompanying drawings.

BRIEF DESCRIPTION OF THE DRAWINGS

In order that the advantages of the invention will be readily understood, a more detailed description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings.

DETAILED DESCRIPTION

In the following discussion, details are presented so as to provide a more thorough understanding of the present invention. However, the present invention may be implemented without one or more of these details as would be apparent to one of ordinary skill in the art. Certain examples are illustrated without elaborate discussion of technical features that would be within the purview of one of ordinary skill in the art so as to avoid confusion with the present invention.

Figure 1:
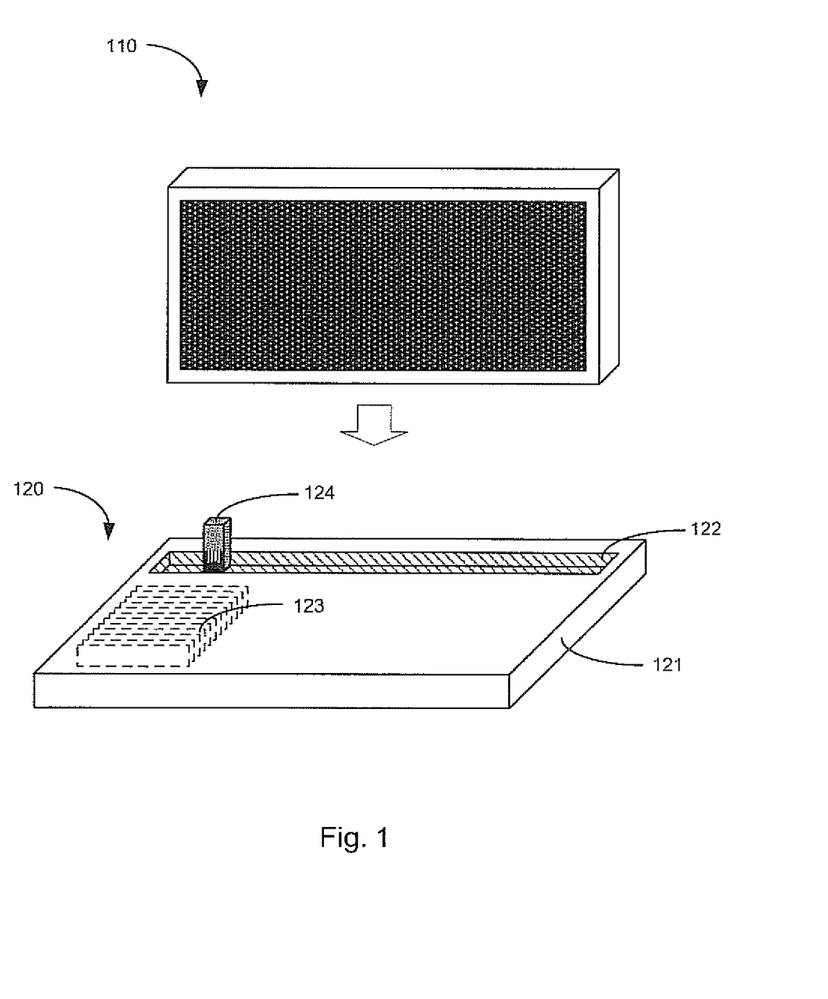
FIG. 1 is a schematic view of an assembly of a flat panel electronic device and an auxiliary heat-dissipating means according to one embodiment of the invention.

According to one embodiment of the invention, an assembly of a flat panel electronic device and an auxiliary heat-dissipating means (hereinafter referred to as the assembly) is provided. FIG. 1 is a schematic view of the assembly. The assembly comprises a flat panel electronic device 110 and an auxiliary heat-dissipating means 120, wherein the flat panel electronic device 110 and the auxiliary heat-dissipating means 120 are in the unassembled state, as shown in FIG. 1.

Figure 2:
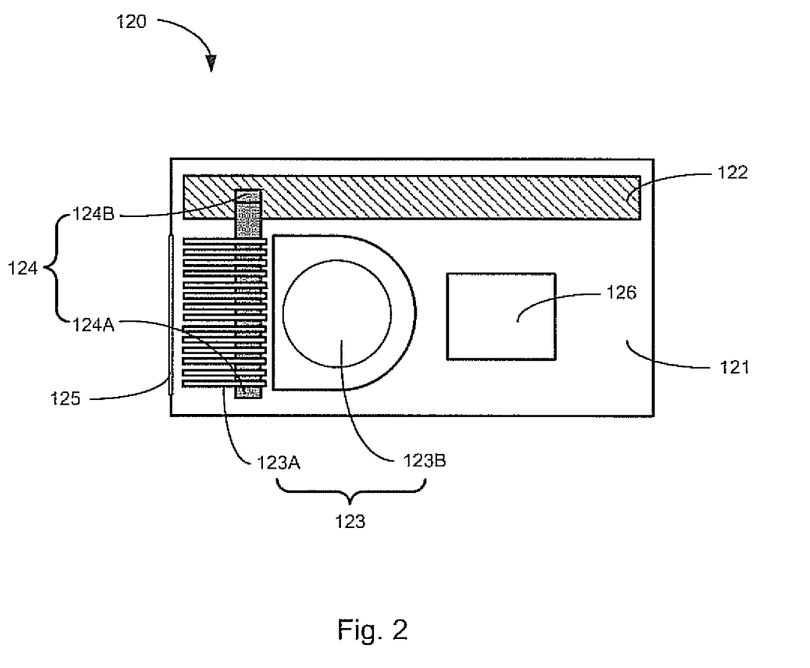
FIG. 2 is a top view of an auxiliary heat-dissipating means according to one embodiment of the invention, wherein the top cover is removed.

The auxiliary heat-dissipating means 120 comprises a base 121, a base heat sink 123 and a heat-conducting plug 124. A perspective view of the auxiliary heat-dissipating means 120 is included in FIG. 1, and FIG. 2 illustrates a top view of the auxiliary heat-dissipating means 120. To show each component clearly, the auxiliary heat-dissipating means 120 is illustrated without a top cover. The auxiliary heat-dissipating means 120 will be described in detail with reference to both FIG. 1 and FIG. 2.

As shown in FIG. 1 and FIG. 2, in one embodiment, the base 121 is in the shape of a general flat cuboid. In other embodiments, the base 121 can have other geometrical shapes. For example, the base can also be in the shape of a pyramid, a cone, a frustum of a pyramid, a frustum of a cone, a sphere, a hemisphere, a spheroidicity or other prisms and polyhedron shapes in addition to the ones already discussed. The base 121 may also be industrially designed for improving the aesthetics, ergonomics, functionality and usability of the device.

Moreover, in one embodiment, the base 121 may be designed for a specific purpose. For example, the base may be configured to have a shape so that it can be easily tethered or secured to the dashboard in a car. Of course, the base 121 in such cases may also have a securing means to secure it to the desired position.

In one embodiment, the base 121 is provided with a recess 122 on a top thereof, and the recess 122 on base 121 can be used for containing a portion of the flat panel electronic device 110. The recess 122 may be designed to match with the shape of the portion of the flat panel electronic device 110 to be contained, so as to secure the flat panel electronic device 110 when it is placed on the base 121. In one embodiment, the recess 122 may also be configured to have a greater size than the portion of the flat panel electronic device 110 to be contained, and the securing function is achieved through other means, such as the heat-conducting plug 124 or the like as described below. In addition, in one embodiment, the recess 122 may be configured to enable a display plane of the flat panel electronic device 110 to be in the upright position or to make a certain angle with the vertical direction when the flat panel electronic device 110 is placed on the base 121. In this way, the auxiliary heat-dissipating means 120 may be applied to different occasions and be suitable for users with different preferences. Of course, the base 121 may include an angle regulating part, for example, a supporting foot, to change the angle of the display plane of the flat panel electronic device 110 relative to the vertical direction when the flat panel electronic device 110 is placed on the base 121. The base 121 provided by the invention may include the various features aforementioned.

The base heat sink 123 is disposed in the base 121. To prevent the base heat sink 123 from dust or collision, the base heat sink 123 may be surrounded by the base 121. To improve the heat-dissipating effect, the base 121 may expose a portion or the entire base heat sink 123. The base heat sink 123 may include one or more of a fin, a radiating pipe and a fan. In one embodiment, the fan may be a common fan or a turbofan.

A first end of the heat-conducting plug 124 thermally contacts with the base heat sink 123, and a second end of the heat-conducting plug 124 extends upward from the bottom of the recess 122 for plugging into a heat-conducting socket 111 (refer to FIG. 4) of the flat panel electronic device 110 when the flat panel electronic device 110 is placed on the base 121. The heat-generating means within the flat panel electronic device, e.g., a processor, a storage, a graphics card chip and/or a power source, etc. produces heat constantly when the flat panel electronic device 110 is working, while the base heat sink 123 has a function of heat dissipation. Thus the first end of the heat-conducting plug 124 is a colder end and the second end is a hotter end.

The hot end absorbs heat from the flat panel electronic device 110, which causes the temperature of the two ends of the heat-conducting plug 124 to be unbalanced and enables the heat to be constantly transmitted from the second end to the first end of the heat-conducting plug 124, such that a heat transmitting path may be formed between the flat panel electronic device 110 and the auxiliary heat-dissipating means 120. In this way, the heat generated by the flat panel electronic device 110 is quickly diffused into the environment to prevent significant heat from accumulating in the flat panel electronic device. This avoids accumulated heat from limiting the performance of the flat panel electronic device. In addition, the heat-conducting plug 124 can also act as a positioning pin to position the flat panel electronic device 110 when the flat panel electronic device 110 is placed on the base 121.

Although the auxiliary heat-dissipating means 120 illustrated in FIG. 1 and FIG. 2 has only one heat-conducting plug 124, the present invention is not limited to comprising only one heat-conducting plug. It will be understood that in one embodiment, the flat panel electronic device 110 may include a plurality of heat-conducting sockets with the quantity and positions corresponding to the heat-conducting plugs 124, where the auxiliary heat-dissipating means 120 includes a plurality of heat-conducting plugs 124. Of course, the flat panel electronic device 110 may include other heat-conducting sockets besides the heat-conducting sockets corresponding to the heat-conducting plugs 124.

Further, the base heat sink 123 comprises a plurality of fins 123A, as shown in FIG. 2. The orientation of the fins 123A is not limited to that illustrated in FIG. 2. The fins 123A are disposed in the base 121, and the first end 124A of the heat-conducting plug 124 is also disposed in the base 121. The first end 124A of the heat-conducting plug 124 thermally contacts with each of the fins 123A inside the base 121 to improve heat-dissipating efficiency. It will be understood that the base 121 should also be provided with a heat-dissipating mechanism to diffuse the heat into the environment when the fins 123A are disposed in the base 121. When the base 121 has a sealed structure, the heat-dissipating mechanism may be a heat-dissipating opening 125 which may be disposed near the fins 123A such as on a side wall, a bottom cover and/or a top cover of the base 121. In one embodiment, the base may also be formed of material comprising holes such as mesh material. In this case, the heat-dissipating mechanism comprises the holes in the mesh material.

In one embodiment, it is preferable to dispose the fins 123A near a side wall of the base 121 with a heat dissipating opening 125 disposed on the side wall. This is preferable compared to disposing the heat-dissipating opening on the top cover or the bottom cover, because it not only has a higher heat-dissipating efficiency but also is more advantageous for dust prevention purposes. The base heat sink 123 also comprises a fan 123B disposed in the base 121. In one embodiment, the fan 123B is disposed near the fins 123A, and the fan 123B and the heat-dissipating opening 125 are disposed at two opposite sides of the fins 123A, respectively. Disposing the fan 123B beside the fins 123A and opposite to the heat-dissipating opening 125 can allow air to flow out from the interior of the base 121. The airflow, therefore, enables the heat of the fins 123A to be quickly diffused into the environment via the heat-dissipating opening 125 so as to improve the heat-dissipating efficiency. On the other hand, the airflow may also prevent dust from entering the base 121. In one embodiment, the fins 123A are disposed perpendicularly to the side wall comprising the heat-dissipating opening 125 so as to form the shortest airflow path and improve the heat-dissipating efficiency.

Figure 3:
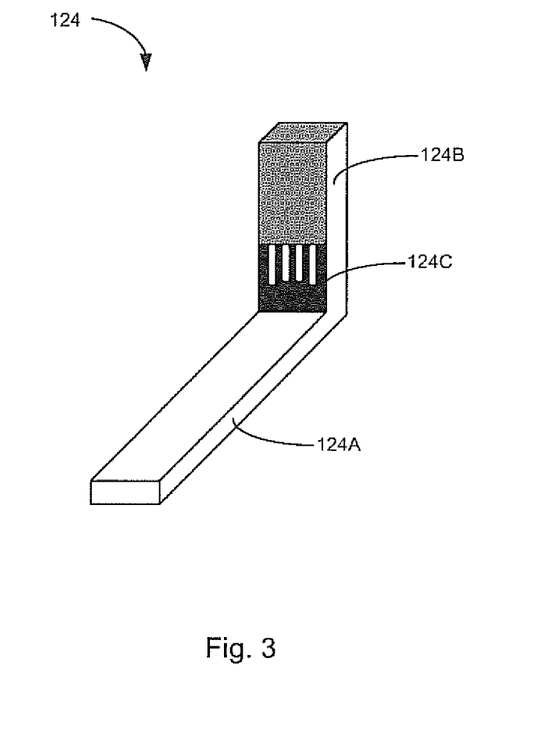
FIG. 3 is a schematic view of a heat-conducting plug according to one embodiment of the invention.

In one embodiment, the fins 123A are disposed parallel to the recess 122. FIG. 3 is a schematic view of a heat-conducting plug according to one embodiment of the invention. In one embodiment, the heat-conducting plug 124 is in the shape of L, as shown in FIG. 3, wherein one side of the L is perpendicular to the recess 122 and extends horizontally in the base 121 to form the first end 124A of the heat-conducting plug 124, and the other side of the L extends upward to form the second end 124B of the heat-conducting plug 124. The above arrangement of the recess 122, the first end 124A of the heat-conducting plug 124 and the fins 123A allows space to be used more efficiently in the base 121 so that the structure of the auxiliary heat-dissipating means 120 is more compact, and the size minimized. This allows the heat-dissipating means 120 to be portable. As mentioned before, in order to be applied to different occasions and be suitable for users with different customs, the second end of the heat-conducting plug 124 can extend upward either vertically or extend upward at a certain angle relative to vertical direction to change the angle of the display plane.

In addition, a plug electrical connector 124C is disposed on a side face of the second end 124B of the heat-conducting plug 124, as shown in FIG. 3. An electrical element 126 is also disposed in the base 121, as shown in FIG. 2. The plug electrical connector 124C is isolated with the heat-conducting plug 124 and is electrically connected with the electrical element 126. As an example, the electrical element 126 may be one or more of a USB interface, a power source interface, a hub, a power source or a storage. In this way, besides the heat-dissipating function, the auxiliary heat-dissipating means 120 may also act as a data transmitting means, a storing means and a charging means for the flat panel electronic device 110. When the electrical element 126 includes a USB interface and/or a hub, an external sound, an external keyboard and/or an external mouse, etc. may be used as the external means. Preferably, the electrical connector 124C may be a flexible circuit board, which allows for better density, miniaturization and high reliability.

Figure 4:
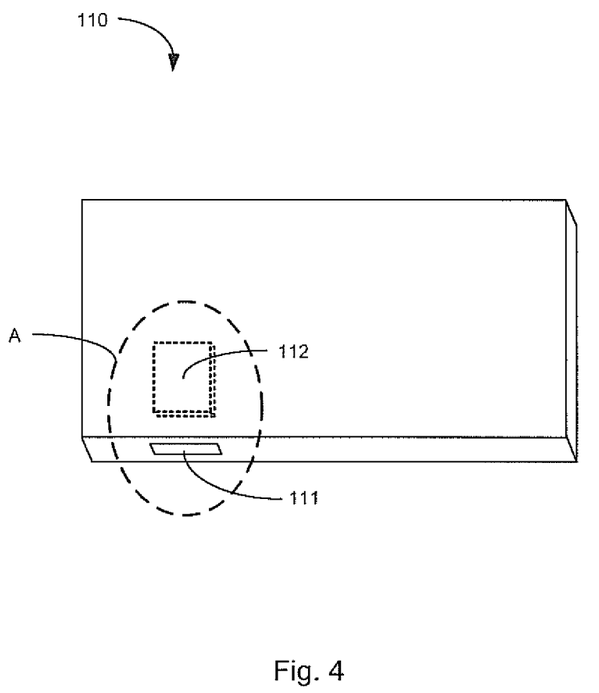
FIG. 4 is a schematic view of a flat panel electronic device according to one embodiment of the invention.
Figure 5:
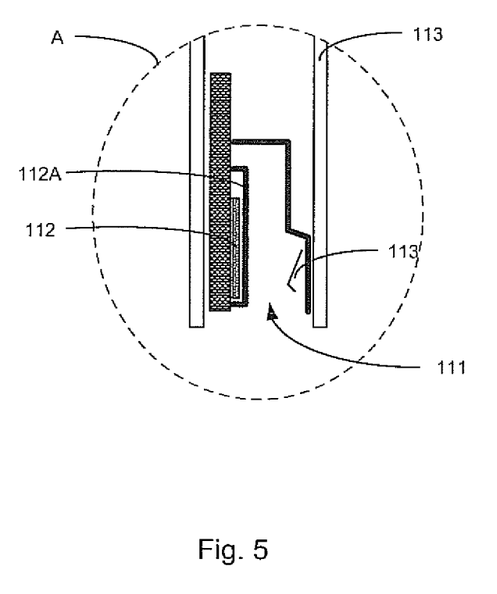
FIG. 5 is a cutaway view of the portion of the flat panel electronic device in area A of FIG. 4 according to one embodiment of the invention.

The flat panel electronic device 110 provided by the present invention will be described in detail referring to FIG. 1 and FIGS. 4-5 below. FIG. 4 is a schematic view of a flat panel electronic device and FIG. 5 is a cutaway view of the portion of the flat panel electronic device in area A of FIG. 4 according to one embodiment of the invention. The flat panel electronic device 110 shown in FIG. 1 is provided with a heat-conducting socket 111, as shown in FIGS. 4-5. A heat-conducting plug 124 of the auxiliary heat-dissipating means 120 is plugged into the heat-conducting socket 111 when the flat panel electronic device 110 is placed on the base 121 of the auxiliary heat-dissipating means 120. The heat-conducting socket 111 is disposed nearby a heat-generating means 112 of the flat panel electronic device 110 as illustrated in FIG. 5. As also shown in FIG. 5, the heat-conducting socket 111 exposes at least a portion of the heat-generating means 112 such that the heat-conducting plug 124 is near the heat-generating means 112 when the heat-conducting plug 124 is plugged into the heat-conducting socket 111. The heat-conducting plug 124 absorbs the heat generated by the heat-generating means 112 and transmits the heat to the base heat sink 123 of the auxiliary heat-dissipating means 120 to improve the heat-dissipating efficiency.

Preferably, the heat-generating means 112 is surrounded by a heat-generating means heat sink 112A, and the heat-conducting socket 111 exposes at least a portion of the heat-generating means heat sink 112A. Disposing the heat-generating means heat sink 112A around the heat-generating means 112 not only improves the heat-dissipating efficiency, but also uniformly diffuses the heat generated by the heat-generating means 112 outwards. This allows the heat-conducting plug 124 plugged into the heat-conducting socket 111 to absorb heat effectively. In addition, the heat-generating means heat sink 112A can also protect the heat-generating means 112.

Where the plug electrical connector 124C is disposed on the side face of the second end 124B of the heat-conducting plug 124 and the base 121 is also provided with the electrical element 126 as mentioned above and as shown in FIGS. 2-3, a socket electrical connector 113 matched with the plug electrical connector 124C is disposed on a side face of the heat-conducting socket 111, so as to enable the socket electrical connector 113 to be electrically connected with the plug electrical connector 124C when the flat panel electronic device 110 is placed on the base 121. And, the socket electrical connector 113 is electrically connected with an electrical means of the flat panel electronic device 110, such that the electrical means of the flat panel electronic device 110 can be electrically connected with the electrical element of the auxiliary heat-dissipating means 120 when the flat panel electronic device 110 is placed on the base 121. It can be appreciated that the data is transmitted to the flat panel electronic device 110 and/or the electric power is supplied to the flat panel electronic device 110 via the auxiliary heat-dissipating means 120. Preferably, the socket electrical connector 113 is an elastic metal sheet, and the plug electrical connector 124C is a metal finger mated with the elastic metal sheet, such that the electrical connection between the socket electrical connector 113 and the plug electrical connector 124C could be a USB connection.

The auxiliary heat-dissipating means of the flat panel electronic device provided by the present invention is advantageous because it can quickly diffuse the heat generated by the flat panel electronic device placed thereon into the environment, and prevent significant heat from accumulating in the flat panel electronic device. This avoids heat accumulation from limiting the performance of the flat panel electronic device.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:
1. An apparatus for dissipating heat, comprising:
a base comprising a recess on a top thereof for containing a portion of a flat panel electronic device;
a base heat sink disposed in the base; and
a heat-conducting plug with a first end thereof thermally contacting with the base heat sink, and with a second end thereof extending upward from a bottom of the recess, said second end operable to plug into a heat- conducting socket of the flat panel electronic device when the flat panel electronic device is placed on the base.

2. The apparatus according to claim 1, wherein the base heat sink comprises a plurality of fins disposed in the base, and wherein the first end of the heat-conducting plug thermally contacts with each of the plurality of fins.

3. The apparatus according to claim 2, wherein the plurality of fins are disposed near a side wall of the base and a heat-dissipating opening is disposed on the side wall, and further wherein, the base heat sink also comprises a fan disposed in the base, wherein the fan is disposed near the plurality of fins, wherein the fan and the heat-dissipating opening are disposed at two opposite sides of the plurality of fins.

4. The apparatus according to claim 3, wherein the plurality of fins are disposed perpendicular to the side wall.

5. The apparatus according to claim 2, wherein the plurality of fins are disposed parallel to the recess and the heat-conducting plug is in a shape of an L, wherein one side of the L is perpendicular to the recess and extends horizontally in the base to form the first end of the heat-conducting plug, and the other side of the L extends upward from the recess to form the second end of the heat-conducting plug.

6. The apparatus according to claim 1, wherein a plug electrical connector is disposed on a side face of the second end of the heat-conducting plug.

7. The apparatus according to claim 1, further comprising an electrical element disposed in the base, wherein the plug electrical connector is electrically connected with the electrical element.

8. The apparatus according to claim 6, wherein the plug electrical connector comprises a flexible circuit board.

9. The apparatus according to claim 7, wherein the electrical element is selected from the group comprising: a USB interface, a power source interface, a hub, a power source and a storage.

10. A flat panel electronic device comprising:
a heat-conducting socket thereon such that a heat-conducting plug of an auxiliary heat-dissipating module is plugged into the heat-conducting socket when the flat panel electronic device is placed on a base of the auxiliary heat-dissipating module; and
a heat-generating element, wherein the heat-conducting socket is disposed near the heat-generating element, and the heat-conducting socket exposes at least a portion of the heat-generating element.

11. The flat panel electronic device according to claim 10, wherein a socket electrical connector is disposed on a side face of the heat-conducting socket, and the socket electrical connector is electrically connected with an electrical element of the flat panel electronic device.

12. The flat panel electronic device according to claim 10, wherein the heat-generating element is surrounded by a heat sink, and the heat-conducting socket exposes at least a portion of the heat sink.

13. An assembly comprising:
a flat panel electronic device comprising a heat-conducting socket thereon, wherein the heat-conducting socket is disposed near a heat-generating element of a flat panel electronic device, and the heat-conducting socket exposes at least a portion of the heat-generating element; and
a heat-dissipating module of the flat panel electronic device, said heat-dissipating module comprising:
a base provided with a recess on a top thereof for containing a portion of a flat panel electronic device;
a base heat sink disposed in the base; and
a heat-conducting plug with a first end thereof thermally contacting with the base heat sink, and a second end thereof extending upward from a bottom of the recess for plugging into a heat-conducting socket of the flat panel electronic device when the flat panel electronic device is placed on the base.

14. The assembly according to claim 13, wherein the base heat sink comprises a plurality of fins disposed in the base, and wherein the first end of the heat-conducting plug thermally contacts with each of the plurality of fins.

15. The assembly according to claim 14, wherein the plurality of fins are disposed near a side wall of the base and a heat-dissipating opening is disposed on the side wall, and further wherein, the base heat sink also comprises a fan disposed in the base, wherein the fan is disposed near the plurality of fins, wherein the fan and the heat-dissipating opening are disposed at two opposite sides of the plurality of fins.

16. The assembly according to claim 15, wherein the plurality of fins are disposed perpendicular to the side wall.

17. The assembly according to claim 14, wherein the plurality of fins are disposed parallel to the recess and the heat-conducting plug is in a shape of an L, wherein one side of the L is perpendicular to the recess and extends horizontally in the base to form the first end of the heat-conducting plug, and the other side of the L extends upward from the recess to form the second end of the heat-conducting plug.

18. The assembly according to claim 13 further comprising:
a socket electrical connector disposed on a side face of the heat-conducting socket, wherein the socket electrical connector is coupled to an electrical element of the flat panel electronic device;
a plug electrical connector matched with the socket electrical connector disposed on a side face of the second end of the heat-conducting plug; and
an electrical element also disposed in the base, wherein the plug electrical connector is coupled to the electrical element.

19. The assembly according to claim 18, wherein the plug electrical connector comprises a flexible circuit board.

20. The assembly according to claim 18, wherein the electrical element is selected from the group comprising: a USB interface, a power source interface, a hub, a power source and a storage.

21. The assembly according to claim 18, wherein the socket electrical connector is an elastic metal sheet, and the plug electrical connector is a metal finger mated with the elastic metal sheet.

* * * * *